(12) United States Patent
You et al.

(10) Patent No.: US 11,910,686 B2
(45) Date of Patent: Feb. 20, 2024

(54) ARRAY SUBSTRATE, METHOD FOR PREPARING ARRAY SUBSTRATE, DISPLAY PANEL AND DISPLAY APPARATUS

(71) Applicant: BOE Technology Group Co., Ltd., Beijing (CN)

(72) Inventors: Juanjuan You, Beijing (CN); Guang Yan, Beijing (CN); Linlin Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 415 days.

(21) Appl. No.: 17/414,546

(22) PCT Filed: Dec. 29, 2020

(86) PCT No.: PCT/CN2020/140999
§ 371 (c)(1),
(2) Date: Jun. 16, 2021

(87) PCT Pub. No.: WO2021/184914
PCT Pub. Date: Sep. 23, 2021

(65) Prior Publication Data
US 2023/0363230 A1    Nov. 9, 2023

(30) Foreign Application Priority Data

Mar. 16, 2020 (CN) .......................... 202010181683.0

(51) Int. Cl.
*H10K 59/38* (2023.01)
*H10K 59/80* (2023.01)
(Continued)

(52) U.S. Cl.
CPC ........... *H10K 59/38* (2023.02); *H10K 59/877* (2023.02); *H10K 59/879* (2023.02); *H10K 71/00* (2023.02); *H10K 2102/331* (2023.02)

(58) Field of Classification Search
CPC .... H10K 59/38; H10K 59/877; H10K 59/879; H10K 71/00; H10K 2102/331; H10K 59/10; H10K 50/85
See application file for complete search history.

(56) References Cited

U.S. PATENT DOCUMENTS

2007/0284567 A1* 12/2007 Pokrovskiy ............. H01L 33/44
  257/E33.068
2009/0147497 A1   6/2009 Nada
(Continued)

FOREIGN PATENT DOCUMENTS

CN   101451673 A   6/2009
CN   106547136 A   3/2017
(Continued)

OTHER PUBLICATIONS

CN202010181683.0 first office action.
CN202010181683.0 second office action.

*Primary Examiner* — Yasser A Abdelaziez
(74) *Attorney, Agent, or Firm* — IPro, PLLC

(57) ABSTRACT

An array substrate is disclosed and includes: a base substrate (1); an excitation light source (2) on a side of the base substrate (1); and a sub pixel on a side of the excitation light source (2) facing away from the base substrate (1). The sub pixel at least includes a first-kind sub pixel (3). The first-kind sub pixel (3) includes a first quantum dot conversion layer (31), a first recycling component layer (32) and a first color film layer (33) sequentially located on the side of the excitation light source (2) facing away from the base substrate (1), and the first recycling component layer (32) is configured to limit at least part of light with a wavelength smaller than a wavelength of emergent light of the first-kind sub pixel (3) into the first recycling component layer (32) and the first quantum dot conversion layer (31).

20 Claims, 7 Drawing Sheets

(51) Int. Cl.
*H10K 71/00* (2023.01)
*H10K 102/00* (2023.01)

(56) References Cited

U.S. PATENT DOCUMENTS

| | | |
|---|---|---|
| 2013/0242228 A1 | 9/2013 | Park et al. |
| 2014/0078716 A1* | 3/2014 | Ninan ............... G02F 1/133617 977/774 |
| 2019/0064602 A1* | 2/2019 | Kim ................. G02F 1/133617 |
| 2019/0072815 A1 | 3/2019 | Chung |
| 2019/0185743 A1* | 6/2019 | Kim ................. G02F 1/133528 |
| 2019/0198583 A1* | 6/2019 | Han ..................... G02B 5/3083 |
| 2020/0033669 A1 | 1/2020 | Park et al. |
| 2020/0052050 A1* | 2/2020 | Jiang .................... H10K 50/814 |
| 2020/0393600 A1 | 12/2020 | Yu et al. |
| 2021/0294152 A1 | 9/2021 | Yu et al. |

FOREIGN PATENT DOCUMENTS

| | | | |
|---|---|---|---|
| CN | 107357080 A | 11/2017 | |
| CN | 109426042 A | 3/2019 | |
| CN | 110187551 A | 8/2019 | |
| CN | 111341939 A | 6/2020 | |

\* cited by examiner

-- Prior Art --

ARRAY SUBSTRATE, METHOD FOR PREPARING ARRAY SUBSTRATE, DISPLAY PANEL AND DISPLAY APPARATUS

CROSS-REFERENCE TO RELATED APPLICATIONS

This application is the National Stage of International Application No. PCT/CN2020/140999, filed on Dec. 29, 2020, which claims the priority of Chinese patent application No. 202010181683.0, filed with the China National Intellectual Property Administration on Mar. 16, 2020, and entitled "Array Substrate, Method for Preparing Array Substrate, Display Panel and Display Apparatus", the entire contents of which are incorporated herein by reference.

FIELD

This disclosure relates to the technical field of display, in particular to an array substrate, a method for preparing the array substrate, a display panel and a display apparatus.

BACKGROUND

Quantum dot light emitting materials have the advantages of being wide in light emitting frequency spectrum coverage range, high in stability, high in color purity and easy to machine and therefore are widely applied to the fields of displayers, illumination, solar cells, biosensors and the like.

In a quantum dot display panel in the related art, quantum dots can be combined with an OLED. The OLED is applied into a backlight module, so that light passes through red and green color filters composed of the quantum dots to achieve the full color. A quantum dot layer cannot completely convert light of an excitation light source by a hundred percent, thus a color film layer is usually arranged to absorb unnecessary light. In order to further improve the conversion efficiency of the quantum dots to a backlight source, an air layer is arranged between the quantum dot layer and the color film layer, thus backlight not absorbed by the quantum dot layer are totally reflected in an interface of the air layer, and reflected back to the quantum dot layer to be reabsorbed so as to improve the conversion efficiency of the quantum dot layer to the light, but red light and green light emitted by the quantum dot layer are partly limited in the quantum dot layer due to total reflection and cannot be taken out of a substrate, thereby influencing the conversion efficiency of the quantum dots.

Therefore, the technical problem urgently needing to be solved by the skilled person in the art is how to improve the light conversion efficiency of the quantum dots.

SUMMARY

Embodiments of the present disclosure provide an array substrate, including:
 a base substrate;
 an excitation light source, located on one side of the base substrate; and
 a sub pixel, located on one side of the excitation light source facing away from the base substrate.

The sub pixel at least includes a first-kind sub pixel. The first-kind sub pixel includes a first quantum dot conversion layer, a first recycling component layer and a first color film layer sequentially located on one side of the excitation light source facing away from the base substrate, and the first recycling component layer is configured to limit at least part of light with a wavelength smaller than a wavelength of emergent light of the first-kind sub pixel into the first quantum dot conversion layer.

In a possible implementation, in the array substrate provided by the embodiments of the present disclosure, a refractive index of the first recycling component layer is equal to a refractive index of the first color film layer.

In a wave band smaller than the wavelength of emergent light of the first-kind sub pixel, a refractive index of the first quantum dot conversion layer is greater than the refractive index of the first recycling component layer.

In a wave band greater than or equal to the wavelength of emergent light of the first-kind sub pixel, the refractive index of the first quantum dot conversion layer is smaller than the refractive index of the first recycling component layer.

In a possible implementation, in the array substrate provided by the embodiments of the present disclosure, the refractive index of the first quantum dot conversion layer is equal to the refractive index of the first recycling component layer.

In the wave band smaller than the wavelength of emergent light of the first-kind sub pixel, the refractive index of the first recycling component layer is greater than the refractive index of the first color film layer.

In the wave band greater than or equal to the wavelength of emergent light of the first-kind sub pixel, the refractive index of the first recycling component layer is smaller than the refractive index of the first color film layer.

In a possible implementation, in the array substrate provided by the embodiments of the present disclosure, the first-kind sub pixel is a red sub pixel and/or a green sub pixel.

In a possible implementation, in the array substrate provided by the embodiments of the present disclosure, the first quantum dot conversion layer includes red quantum dots and scattering particles; and/or green quantum dots and the scattering particles.

In a possible implementation, in the array substrate provided by the embodiments of the present disclosure, the sub pixel further includes: a second-kind sub pixel.

The second-kind sub pixel includes: a scattering layer, a planarization layer and a second color film layer sequentially located on one side of the excitation light source facing away from the base substrate.

A wavelength of emergent light of the second-kind sub pixel is smaller than the wavelength of emergent light of the first-kind sub pixel.

In a possible implementation, in the array substrate provided by the embodiments of the present disclosure, a refractive index of the scattering layer is smaller than or equal to a refractive index of the planarization layer.

The refractive index of the planarization layer is smaller than or equal to a refractive index of the second color film layer.

In a possible implementation, in the array substrate provided by the embodiments of the present disclosure, the first quantum dot conversion layer is arranged on a layer same as the scattering layer.

The first recycling component layer is arranged on a layer same as the planarization layer.

The first color film layer is arranged on a layer same as the second color film layer.

In a possible implementation, in the array substrate provided by the embodiments of the present disclosure, a thickness of the first-kind sub pixel is equal to that of the second-kind sub pixel in a direction perpendicular to the base substrate.

In a possible implementation, in the array substrate provided by the embodiments of the present disclosure, the second-kind sub pixel is a blue sub pixel.

In a possible implementation, in the array substrate provided by the embodiments of the present disclosure, the excitation light source is configured to emit white light or blue light.

In a second aspect, embodiments of the present disclosure further provide a method for preparing the array substrate provided by any embodiment in the first aspect, including:
providing a base substrate;
forming an excitation light source on the base substrate; and
forming a first-kind sub pixel on one side of a light emergent surface of the excitation light source.

The first-kind sub pixel includes a first quantum dot conversion layer, a first recycling component layer and a first color film layer sequentially located on the excitation light source.

In a possible implementation, the method for preparing the array substrate provided by the embodiments of the present disclosure, further includes:
forming a second-kind sub pixel on one side of the light emergent surface of the excitation light source.

An orthographic projection of the second-kind sub pixel on the base substrate is not overlapped with an orthographic projection of the first-kind sub pixel on the base substrate.

The second-kind sub pixel includes a scattering layer, a planarization layer and a second color film layer sequentially located on the excitation light source.

In a third aspect, embodiments of the present disclosure further provide a display panel, including: the array substrate provided by any above embodiment, and an encapsulation cover plate located on one side of a light emergent surface of the array substrate.

In a fourth aspect, embodiments of the present disclosure further provide a display apparatus, including the display panel provided by the embodiments in the third aspect, and a protective shell surrounding the display panel.

DETAILED DESCRIPTION OF THE EMBODIMENTS

Figure 1:
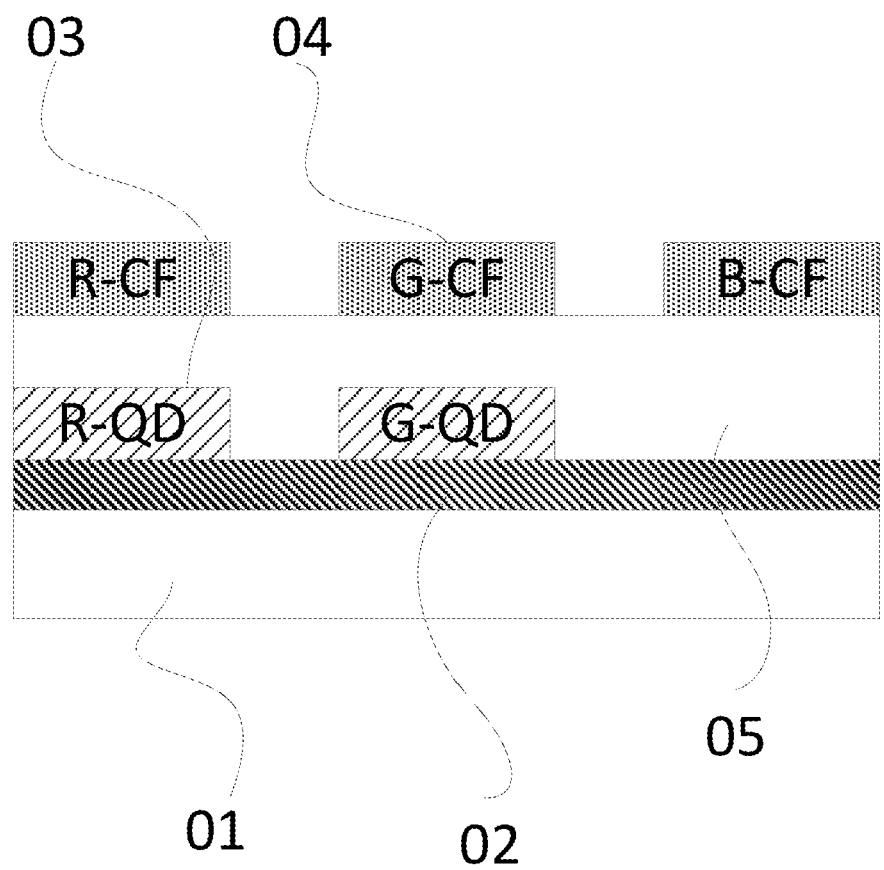
FIG. 1 is a schematic structural diagram of a quantum dot display panel in the related art.

A quantum dot array substrate in the related art, as shown in FIG. 1, includes a base substrate 01, a backlight source 02 on the base substrate 01, a quantum dot layer 03 (including a red quantum dot layer R-QD and a green quantum dot layer G-QD) on one side of the backlight source 02 facing away from the base substrate 01, a color film layer 04 (including: a red color film layer R-CF, a green color film layer G-CF and a blue color film layer B-CF) on one side of the quantum dot layer 03 facing away from the base substrate 01, and an air layer 05 between the quantum dot layer 03 and the color film layer 04. Backlight emitted by the backlight source 02 excites the quantum dot layer 03 to emit red light or green light which is emergent light from the sub pixels, and the color film layer 04 absorbs unconverted backlight, so that needed colors of the emergent light from the sub pixels can be obtained.

In order to further improve the conversion efficiency of the quantum dot layer 03 to the light emitted by the backlight source 02, the air layer 05 is arranged between the quantum dot layer 03 and the color film layer 04, and thus the backlight not absorbed by the quantum dot layer 03 are totally reflected in an interface of the air layer 05, and reflected back to the quantum dot layer 03 to be reabsorbed so as to improve the conversion efficiency of the quantum dot layer 03 to the light. But the red light and the green light emitted by the quantum dot layer 03 are also totally reflected on the interface of the air layer 05, the part of totally reflected light (the red light or the green light) is limited in the quantum dot layer 03 and cannot be taken out of the array substrate, thereby influencing the conversion efficiency of quantum dots.

Based on solving the above problem existing in the quantum dot array substrate in the related art, embodiments of the present disclosure provide an array substrate, a method for preparing the array substrate, a display panel and a display apparatus. In order to make the objective, technical solutions and advantages of the present disclosure more clear, the specific implementations of the array substrate, the method for preparing the array substrate, the display panel and the display apparatus provided by the embodiments of the present disclosure are illustrated in detail with reference to the drawings. It should be understood that preferred embodiments described below are only used to illustrate and explain the present disclosure rather than limiting the present disclosure. The embodiments in the present application and characteristics in the embodiments may be mutually combined in the case of no conflict.

Shapes and sizes of all components in the drawings do not reflect the true scale and are only intended to illustrate the contents of the present disclosure schematically.

Figure 2:
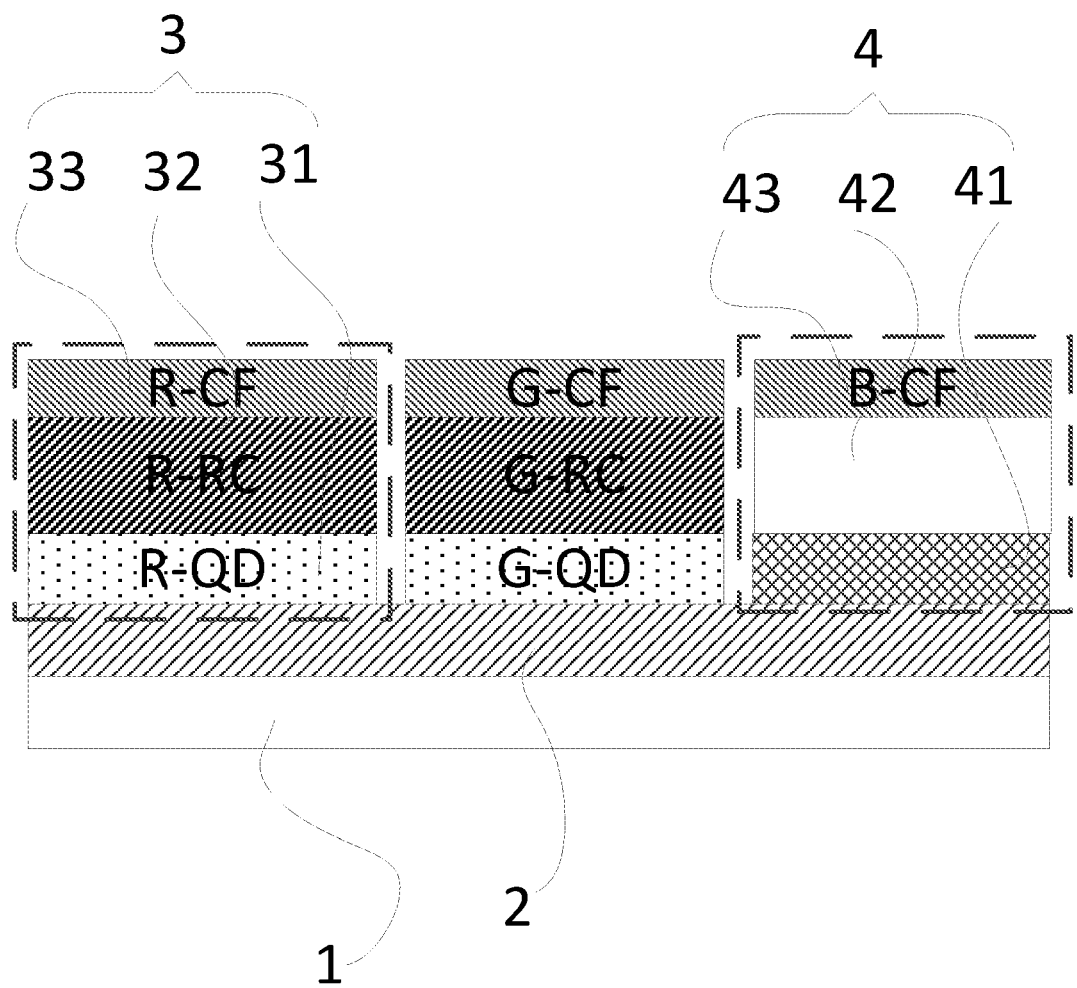
FIG. 2 is a schematic structural diagram of an array substrate provided by an embodiment of the present disclosure.

Embodiments of the present disclosure provide an array substrate. As shown in FIG. 2, the array substrate includes a base substrate 1, an excitation light source 2, and a sub pixel.

The base substrate 1 may be a glass plate, an acrylic plate or a sapphire substrate and so on.

The excitation light source 2 is on a side of the base substrate 1.

The sub pixel is on a side of the excitation light source 2 facing away from the base substrate 1. The sub pixel at least includes a first-kind sub pixel 3. The first-kind sub pixel 3 includes a first quantum dot conversion layer 31, a first recycling component layer (a first dimming layer) 32 and a first color film layer 33 sequentially located on a side of the excitation light source 2 facing away from the base substrate 1. The first recycling component layer 32 is configured to limit at least part of light with a wavelength smaller than a wavelength of an emergent light of the first-kind sub pixel 3 into the first quantum dot conversion layer 31.

The array substrate provided by embodiments of the present disclosure includes the base substrate; the excitation light source, and the sub pixel. The excitation light source is on a side of the base substrate. The sub pixel is on a side of the excitation light source facing away from the base substrate. The sub pixel at least includes the first-kind sub pixel. The first-kind sub pixel includes the first quantum dot conversion layer, the first recycling component layer and the first color film layer sequentially located on a side of the excitation light source facing away from the base substrate. The first recycling component layer is configured to limit the at least part of the light with a wavelength smaller than the wavelength of the emergent light of the first-kind sub pixel into the first recycling component layer and the first quantum dot conversion layer. The first quantum dot conversion layer, the first recycling component layer and the first color film layer are designed to limit the at least part of the light with a wavelength smaller than the wavelength of the emergent light of the first-kind sub pixel into the first recycling component layer and the first quantum dot conversion layer, the part of light which is limited can be reutilized by the first quantum dot conversion layer to excite the light with the wavelength of the emergent light of the first-kind sub pixel, thereby improving the light conversion efficiency of the array substrate.

Optionally, as shown in FIG. 2, the first-kind sub pixel 3 may be a red sub pixel or a green sub pixel. When being the red sub pixel, the first-kind sub pixel includes a first quantum dot conversion layer R-QD, a first recycling component layer R-RC and a first color film layer R-CF; and when being the green sub pixel, the first-kind sub pixel includes a first quantum dot conversion layer G-QD, a first recycling component layer G-RC and a first color film layer G-CF.

Figure 3A:
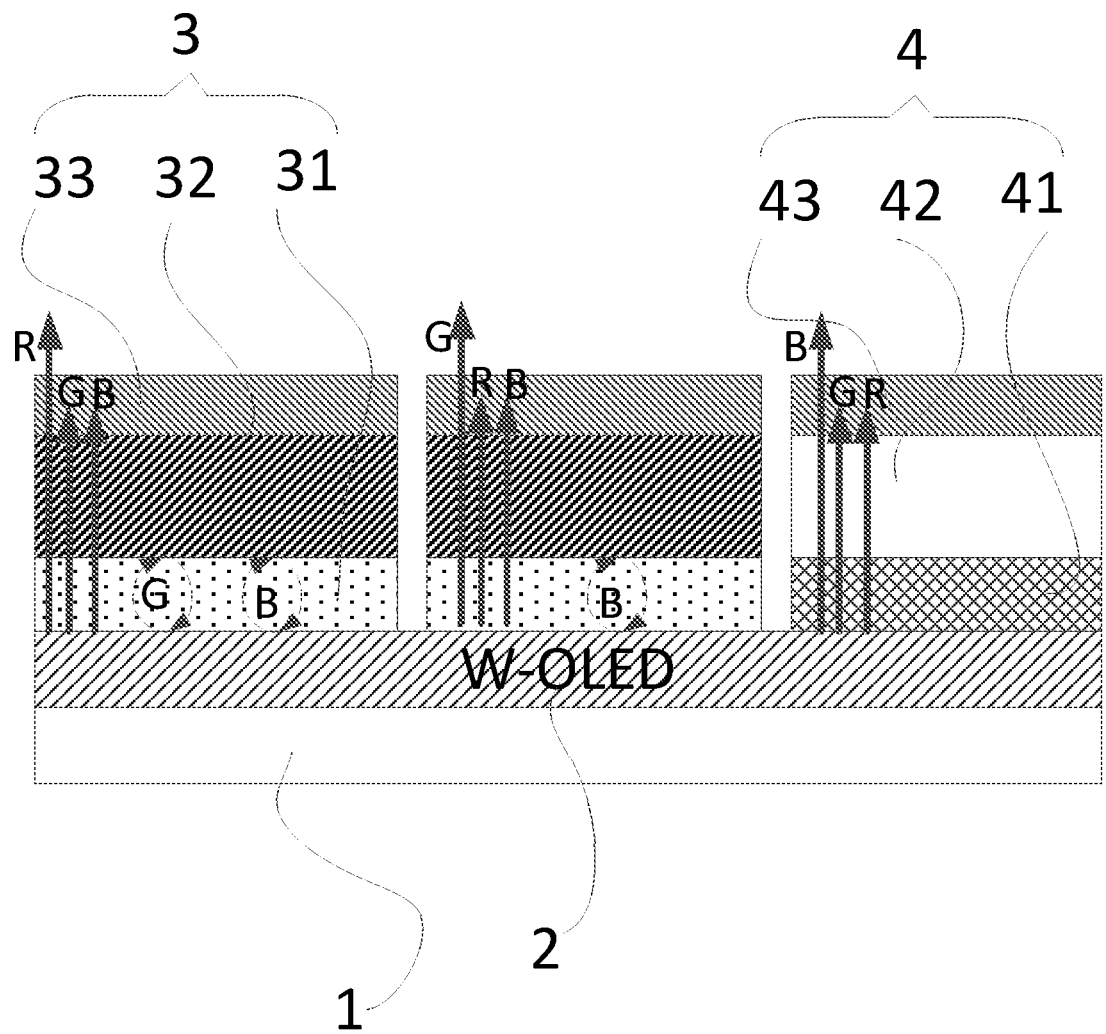
FIG. 3A is a schematic diagram of a principle structure of an array substrate provided by an embodiment of the present disclosure.

Optionally, in the array substrate provided by embodiments of the present disclosure, as shown in FIG. 3A, a refractive index n2 of the first recycling component layer 32 is equal to a refractive index n3 of the first color film layer 33.

In a wave band smaller than the light emergent wavelength of the first-kind sub pixel 3, a refractive index n1 of the first quantum dot conversion layer 31 is greater than the refractive index n2 of the first recycling component layer 32.

In a wave band greater than or equal to the wavelength of emergent light of the first-kind sub pixel 3, the refractive index n1 of the first quantum dot conversion layer 31 is smaller than the refractive index n2 of the first recycling component layer 32.

In the array substrate provided by embodiments of the present disclosure, as shown in FIG. 3A, taking an example that the excitation light source 2 emits white light and the first-kind sub pixel 3 is the red sub pixel for illustration.

The refractive index n2 of the first recycling component layer 32 is equal to the refractive index n3 of the first color film layer 33, that is, the first recycling component layer 32 and the first color film layer 33 may be regarded as one film layer in the aspect of the refractive index, and there is a boundary only between the first quantum dot conversion layer 31 and the first recycling component layer 32. As for the wave band (the green light and blue light) smaller than the wavelength of the emergent light of the first-kind sub pixel 3, because n1 is greater than n2, the light is propagated from an optically dense medium to an optically thinner medium, and because the light will be scattered after passing through the first quantum dot conversion layer 31, the light is emergent from all angles. When a light emergent angle is greater than a critical angle, the green light and the blue light are totally reflected on the boundary between the first quantum dot conversion layer 31 and the first recycling component layer 32, and reflected back to the first quantum dot conversion layer 31 to be reutilized so as to improve the conversion efficiency of the first quantum dot conversion layer 31 to the light. As for the wave band (the red light) greater than or equal to the wavelength of the emergent light of the first-kind sub pixel 3, because n1 is smaller than n2, the light is propagated from the optically thinner medium to the optically dense medium, the total reflection condition is not met, therefore, the red light is not totally reflected on the boundary between the first quantum dot conversion layer 31 and the first recycling component layer 32, that is, all the red light can be taken out of the array substrate, so as to improve the light conversion efficiency of the first quantum dot conversion layer in the first-kind sub pixel 3.

It should be noted that not all of the green light and the blue light are totally reflected on the boundary between the first quantum dot conversion layer and the first recycling component layer. The blue light and the green light can be possibly emergent in all the direction after passing through the first quantum dot conversion layer, therefore, only the blue light and the green light with an incident angle greater than the critical angle are totally reflected, light in other angles can penetrate through the first recycling component layer to different degrees but can be absorbed by the first color film layer finally, that is, only the red light is emergent from the first color film layer.

Similarly, when the first-kind sub pixel is the green sub pixel and is excited through the white light, a wavelength of the blue light is smaller than a wavelength of the green light, thus the blue light meeting the total reflection condition is totally reflected on the boundary between the first quantum dot conversion layer and the first recycling component layer and be reutilized by the first quantum dot conversion layer, while the green light, the red light with a wavelength greater than the wavelength of the green light, and the blue light not totally reflected penetrate through the first recycling component layer. However, the blue light and the red light can be absorbed by the first color film layer, and thus only the green light is taken out of the array substrate for displaying.

When the first-kind sub pixel is the red sub pixel, in the wave band (the green light and the blue light) smaller than the wavelength of the emergent light of the first-kind sub pixel, n1 is greater than n2. A difference value between n1 and n2 needs to be greater than 0.05. This is because if the difference value is smaller than or equal to 0.05, the effect that the green light and the blue light are totally reflected on the interface between the first quantum dot conversion layer and the first recycling component layer is poor, the amount of the green light and the amount of the blue light which are limited in the first quantum dot conversion layer are small. Preferably, the difference value between n1 and n2 may be set to be 0.1. In the wave band (the red light) greater than or equal to the wavelength of the emergent light of the first-kind sub pixel, n1 needs to be made to be smaller than n2 in order to prevent the red light from being totally reflected on the interface between the first quantum dot conversion layer and the the first recycling component layer, the difference value between n1 and n2 needs to be smaller than so as to guarantee that the red light is taken out to a greatest extent. When the first-kind sub pixel is the green sub pixel, the set principle of the difference value between n1 and n2 is the same as that of the above embodiment, which is not repeated here.

Figure 3B:
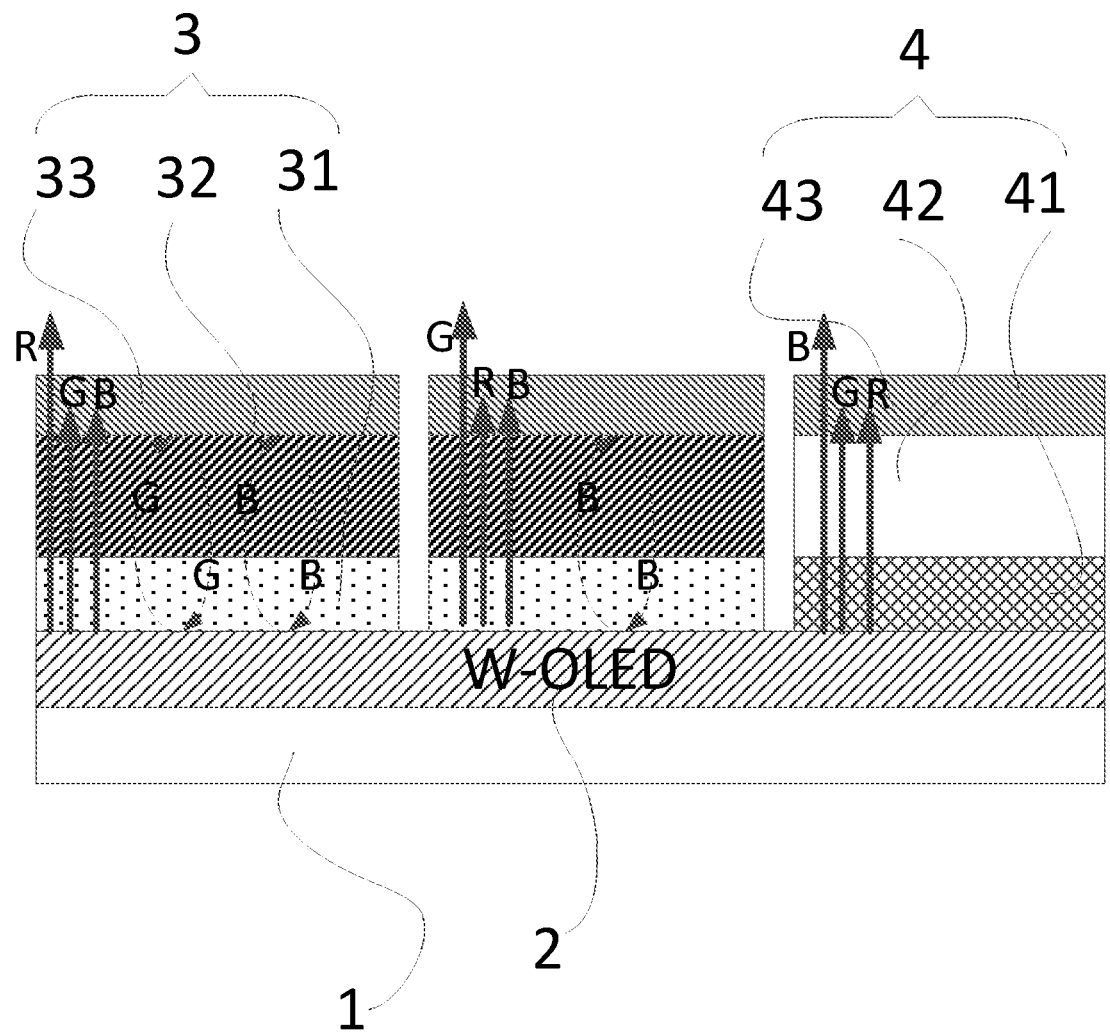
FIG. 3B is a schematic diagram of another principle structure of an array substrate provided by an embodiment of the present disclosure.

Optionally, in the array substrate provided by embodiments of the present disclosure, as shown in FIG. 3B, the refractive index n1 of the first quantum dot conversion layer 31 is equal to the refractive index n2 of the first recycling component layer 32.

In the wave band smaller than the wavelength of the emergent light of the first-kind sub pixel 3, the refractive index n2 of the first recycling component layer 32 is greater than the refractive index n3 of the first color film layer 33.

In the wave band greater than or equal to the wavelength of the emergent light of the first-kind sub pixel 3, the refractive index n2 of the first recycling component layer 32 is smaller than the refractive index n3 of the first color film layer 33.

In the array substrate provided by embodiments of the present disclosure, as shown in FIG. 3B, taking an example that the excitation light source 2 emits the white light and the first-kind sub pixel 3 is the red sub pixel for illustration.

Due to n1 is equal to n2, in the aspect of the refractive index, the first quantum dot conversion layer 31 and the first recycling component layer 32 may be regarded as the same film layer. The blue light and the green light meeting the total reflection condition are totally reflected on the interface between the first recycling component layer 32 and the first color film layer 33, and the blue light and the green light are reflected back to the first quantum dot conversion layer 31 to be reutilized. Similarly, when the first-kind sub pixel 3 is the green sub pixel, the blue light meeting the total reflection condition is totally reflected on the interface between the first recycling component layer 32 and the first color film layer 33, and the blue light is reflected back to the first quantum dot conversion layer 31 to be reutilized. The specific principle is the same as that of the above embodiments, which is not repeated here.

Figure 4A:
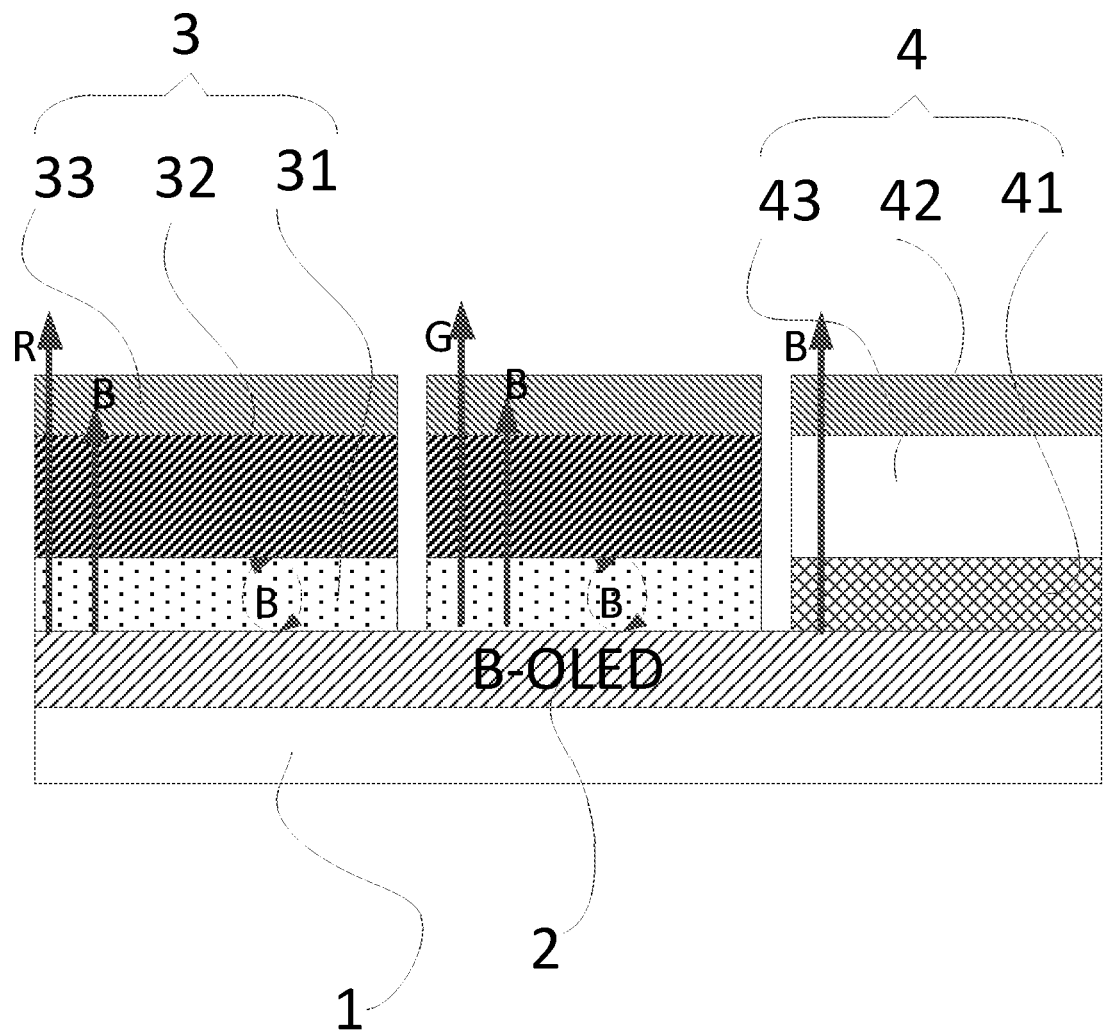
FIG. 4A is a schematic diagram of further principle structure of an array substrate provided by an embodiment of the present disclosure.
Figure 4B:
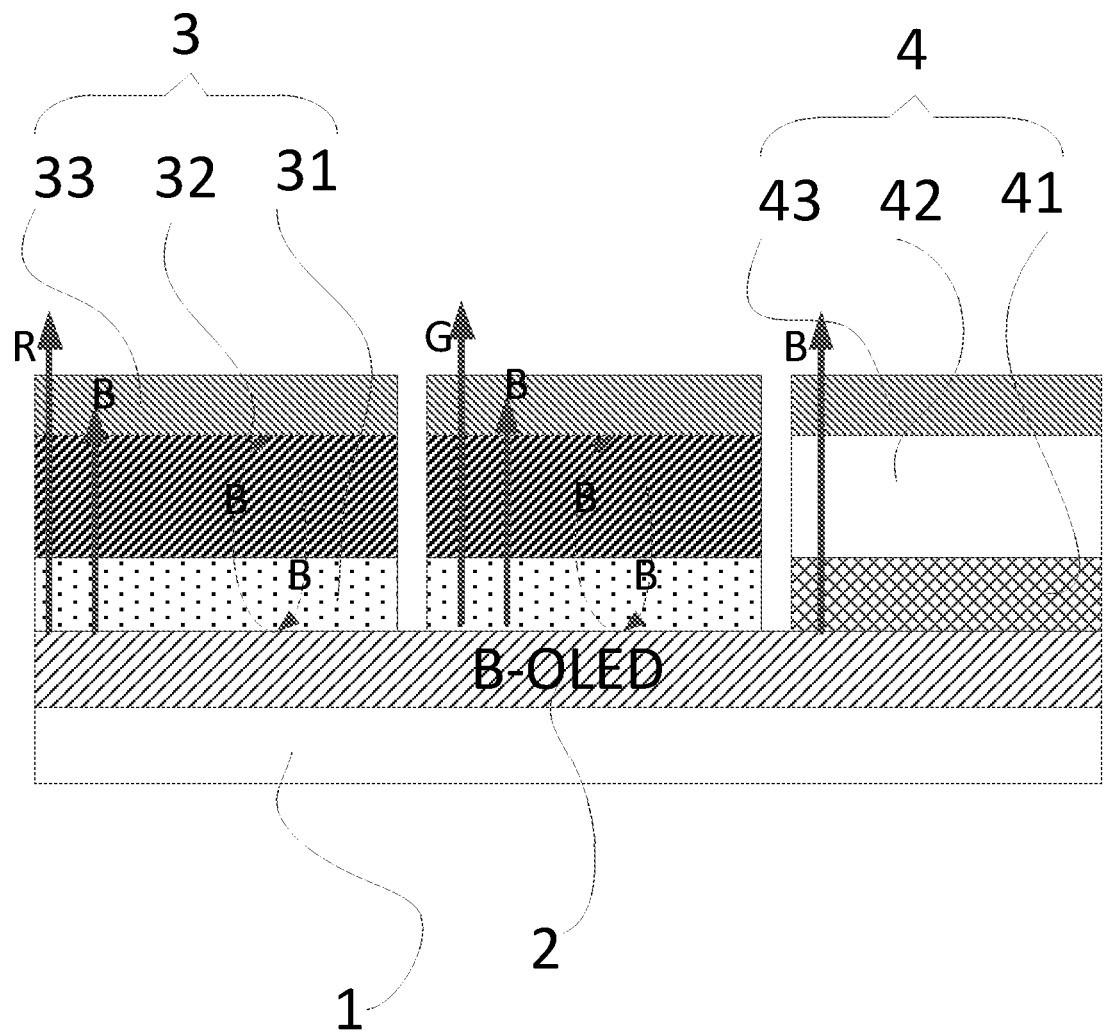
FIG. 4B is a schematic diagram of yet further principle structure of an array substrate provided by an embodiment of the present disclosure.

Optionally, in the array substrate provided by embodiments of the present disclosure, excitation light source processing may be white light excitation, or may further be blue light excitation as shown in FIG. 4A and FIG. 4B.

When the blue light excitation is adopted, because the excitation light source has no red light and green light, emergent light after passing through the first quantum dot conversion layer 31 only has the light with the wavelength of the emergent light of the first-kind sub pixel and the blue light, there is no light with other colors to be absorbed by the first color film layer, thereby reducing the loss amount of the light.

A structural diagram shown in FIG. 4A and FIG. 4B and a structural diagram shown in FIG. 3A and FIG. 3B are different in the type of the light emitted by the excitation light source, one emits the blue light, the other one emits the white light, other principles are all the same and have be elaborated in detail in the embodiments of the emergent light in FIG. 3A and FIG. 3B, which is not repeated here.

Optionally, in the array substrate provided by the embodiments of the present disclosure, the first quantum dot conversion layer includes: red quantum dots and scattering particles; and/or green quantum dots and scattering particles.

The scattering particles are evenly dispersed in the red quantum dots and/or the green quantum dots, and the utilization rate of excitation light in the first quantum dot conversion layer can be increased, so that more excitation light can be irradiated to the quantum dots to improve the light conversion efficiency.

The first quantum dot conversion layer may include a quantum dot material, and the quantum dots are nano particles composed of II-VI group elements or III-V group elements. The particle size of the quantum dot is generally between 1-20 nm. Electrons and holes are subjected to range limitation by quanta, thus a continuous energy band structure turns into a discrete energy level structure with molecular characteristics, and fluorescence can be emitted after being excited. The emission spectrum of the quantum dots can be controlled by changing the size of the quantum dots, and the emission spectrum can be made to cover the whole visible light region by changing the size and chemical compositions of the quantum dots. The quantum dot material may be at least one of zinc oxide, graphene, cadmium selenide (CdSe), cadmium sulfide (CdS), cadmium telluride (CdTe), zinc selenide (ZnSe), zinc telluride (ZnTe), zinc sulfide (ZnS), perovskite ($APbX_3$, A=Cs, methylamine (MA) and FA amine; X=Cl, Br, I) and indium ($CuInS_2$, InP). The quantum dots are dispersed in a dispersion medium, and the dispersion medium includes acrylic resin, epoxy resin, styrene resin, polyolefin resin, polyoxyalkylene resin or a mixture thereof. In order to improve the light conversion efficiency, the scattering material(s) is/are further dispersed in the dispersion medium, such as titanium oxide and silicon oxide.

Optionally, in the array substrate provided by embodiments of the present disclosure, as shown in FIG. 2, the sub pixel further includes a second-kind sub pixel 4.

The second-kind sub pixel 4 includes: a scattering layer 41, a planarization layer 42 and a second color film layer 43 sequentially located on a side of the excitation light source 2 facing away from the base substrate 1.

A wavelength of emergent light of the second-kind sub pixel 4 is smaller than the wavelength of the emergent light of the first-kind sub pixel 3.

The second-kind sub pixel may be a blue sub pixel. An OLED is adopted as a backlight source, a white light OLED or a blue light OLED each includes the blue light, the light emitting intensity may be used for displaying, and energy of the excitation light source is not enough to excite blue quantum dots to emit light. Therefore, the scattering layer rather than a blue quantum dot film layer is arranged at a light emergent position of the blue sub pixel so as to improve light emergent uniformity.

When the blue light is adopted as the excitation light source, the blue light sequentially penetrates through the scattering layer, the planarization layer and the second color film layer. When the white light excitation is adopted, the white light penetrates through the scattering layer and the planarization layer, but the red light and the green light are finally absorbed by the second color film layer, and only the blue light can be taken out of the array substrate for displaying.

It should be noted that the white light OLED or the blue light OLED each includes a first electrode, an organic electroluminescence layer and a second electrode. The organic electroluminescence layer is arranged between the first electrode and the second electrode, and includes an organic light emitting layer, which can emit the light under driving of an electric field between the first electrode and the second electrode. The first color film layer and the second color film layer are each made of organic transparent color resistance or inorganic transparent materials, including light-emergent light absorbing pigment and the dispersion medium such as acrylic resin, epoxy resin, styrene resin, polyolefin resin, polyoxyalkylene resin. The parts other than parts with the specific wavelength range can be blocked, for example, R-CF can block the blue light and the green light, but can allow the red light to pass through.

Optionally, in the array substrate provided by embodiments of the present disclosure, a refractive index of the scattering layer is smaller than or equal to a refractive index of the planarization layer.

The refractive index of the planarization layer is smaller than or equal to a refractive index of the second color film layer.

The refractive index of the scattering layer, the refractive index of the planarization layer and the refractive index of the second color film layer may be set to be equal, or to be sequentially and progressively increased. In this way, the excitation light can be prevented from being totally reflected on the interfaces among all the film layers, thereby increasing the utilization rate of the light.

Optionally, in the array substrate provided by embodiments of the present disclosure, the first quantum dot conversion layer and the scattering layer are arranged on the same layer.

The first recycling component layer and the planarization layer are arranged on the same layer.

The first color film layer and the second color film layer are arranged on the same layer.

The expressed arrangement on the same layer refers to the same layer in the aspect of the position, and the materials of the film layers arranged on the same layer of the different sub pixels may be the same, or different, or partly same. A base material of the first recycling component layer may adopt an inorganic material or an organic material. The materials of an inorganic layer may be silicon nitride (SiNx), silicon oxide (SiO2), silicon carbide (SiC), sapphire (Al2O3), zinc sulfide (ZnS) or zinc oxide (ZnO) and so on; and the materials of an organic layer may be polyvinyl pyrrolidone (PVP), polyvinyl alcohol (vinylalcohol polymer, PVA), aluminum 8-hydroxyquinolinate (Alq), N,N'-diphenyl-N,N'-(1-naphthyl)-1,1'-biphenyl-4,4'-diamine (NPB) or HATCN and so on, which can be selected and combined according to actual needs, and is not specifically limited here.

Optionally, in the array substrate provided by embodiments of the present disclosure, a thickness of the first-kind sub pixel is equal to that of the second-kind sub pixel in a direction perpendicular to the base substrate.

The overall thickness of the first-kind sub pixel and the overall thickness of the second-kind sub pixel are arranged to be the same, thereby facilitating encapsulation of the film layers. The thicknesses of the light emergent film layers included in the first-kind sub pixel and the second-kind sub pixel may be the same or different, which can be selected according to actual needs, and is not repeated here.

It should be noted that in the array substrate provided by embodiments of the present disclosure, the thickness of the first-kind sub pixel is equal to that of the second-kind sub pixel, which is not limited to be identically equal in the strict sense and refers to that the thickness of the first-kind sub pixel and the thickness of the second-kind sub pixel are roughly equal. For example, the thickness between the first-kind sub pixel and the second-kind sub pixel floats up or down by the size within 5%, which is regarded as that the thickness of the first-kind sub pixel is equal to that of the second-kind sub pixel.

Based on the same inventive concept, embodiments of the present disclosure further provide a method for preparing an array substrate, including:

providing a base substrate;

forming an excitation light source on the base substrate; and forming a first-kind sub pixel is on a side of a light emergent surface of the excitation light source.

The first-kind sub pixel includes a first quantum dot conversion layer, a first recycling component layer and a first color film layer sequentially located on the excitation light source.

Optionally, the method for preparing the array substrate provided by embodiments of the present disclosure, further includes forming a second-kind sub pixel on a side of the light emergent surface of the excitation light source.

An orthographic projection of the second-kind sub pixel on the base substrate is not overlapped with an orthographic projection of the first-kind sub pixel on the base substrate.

The second-kind sub pixel includes a scattering layer, a planarization layer and a second color film layer sequentially located on the excitation light source.

The method for preparing the array substrate has all the advantages of the array substrate provided by any above embodiment. Technologies adopted for forming all the structures are the same or similar to technologies in the related art and may be implemented by referring to any embodiment of the above array substrate and technology means in the related art, which is not repeated here.

Figure 5:
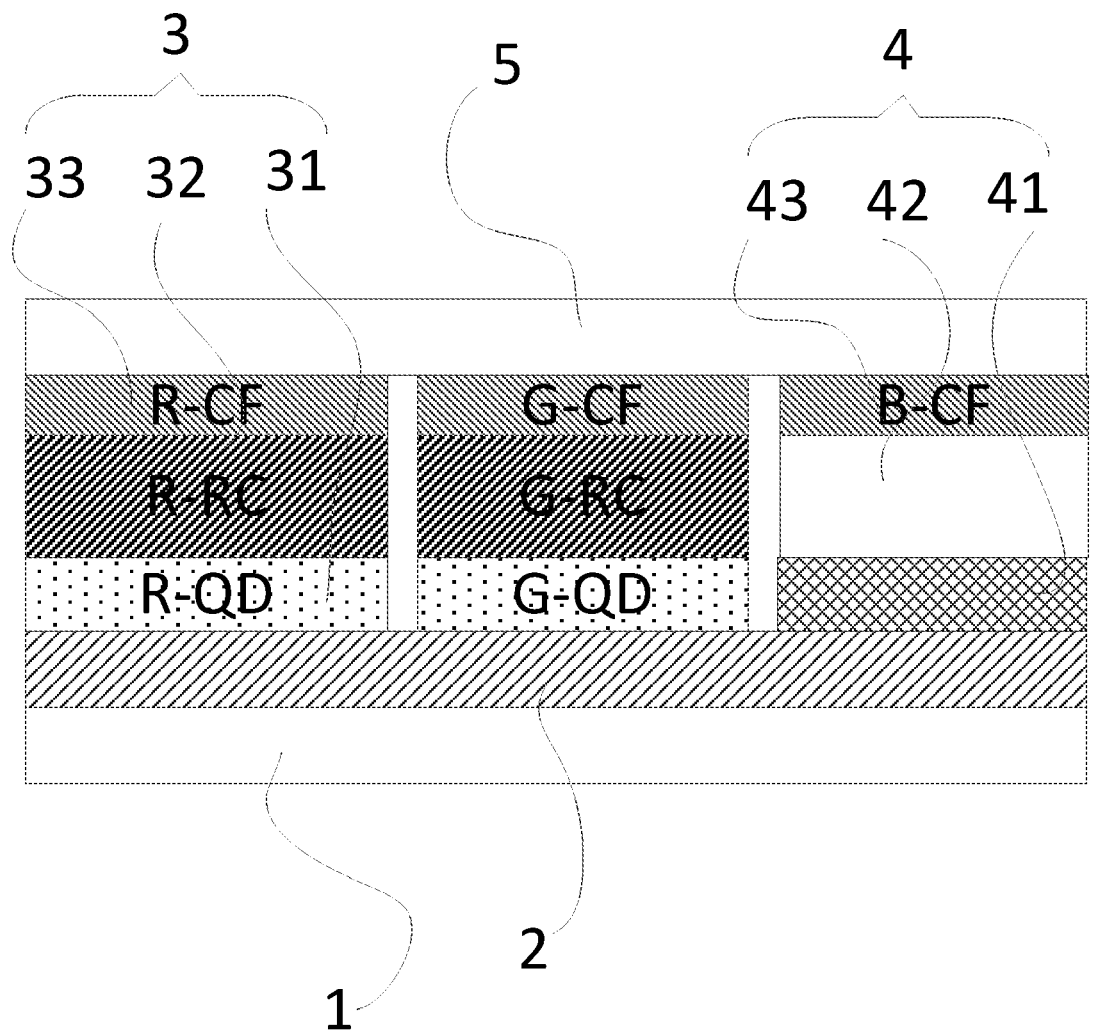
FIG. 5 is a schematic structural diagram of a display panel provided by an embodiment of the present disclosure.

Based on the same inventive concept, embodiments of the present disclosure further provide a display panel, as shown in FIG. 5, including the array substrate provided by any above embodiment, and an encapsulation cover plate 5 located on one side of a light emergent surface of the array substrate.

The display panel has all the advantages of the array substrate provided by any above embodiment and may be implemented by referring to any embodiment of the above array substrate, which is not repeated here.

Based on the same inventive concept, embodiments of the present disclosure further provide a display apparatus, including the display panel in the above embodiment, and a protective shell surrounding the display panel.

The display apparatus may be any product or component with a display function, such as a mobile phone, a tablet computer, a television, a displayer, a notebook computer, a digital photo frame and a navigator. It should be understood by a person of ordinary skill in the art that the display apparatus should have other essential constituent parts, which is not repeated here and may also not be regarded as limitation to the present disclosure.

Embodiments of the present disclosure provide the array substrate, the method for preparing the array substrate, the display panel and the display apparatus. The array substrate includes: the base substrate; the excitation light source, located on one side of the base substrate; and the sub pixel, located on one side of the excitation light source facing away from the base substrate. The sub pixel at least includes the first-kind sub pixel, the first-kind sub pixel includes the first quantum dot conversion layer, the first recycling component layer and the first color film layer sequentially located on one side of the excitation light source facing away from the base substrate, and the first recycling component layer is configured to limit at least part of light smaller than the light emergent wavelength of the first-kind sub pixel into the first recycling component layer and the first quantum dot conversion layer. The first quantum dot conversion layer, the first recycling component layer and the first color film layer are designed to limit the at least part of light smaller than the light emergent wavelength of the first-kind sub pixel into the first recycling component layer and the first quantum dot conversion layer, the part of limited light can be reutilized by the first quantum dot conversion layer to excite the light with the light emergent wavelength of the first-kind sub pixel, thereby improving the light conversion efficiency of the array substrate.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. An array substrate, comprising:
a base substrate;
an excitation light source on a side of the base substrate; and
a sub pixel on a side, facing away from the base substrate, of the excitation light source;
wherein the sub pixel at least comprises:
a first-kind sub pixel;
wherein the first-kind sub pixel comprises:
a first quantum dot conversion layer, a first recycling component layer and a first color film layer sequentially located on the side, facing away from the base substrate, of the excitation light source;
wherein the first recycling component layer is configured to limit at least part of light with a wavelength, smaller than a wavelength of emergent light of the first-kind sub pixel, into the first quantum dot conversion layer;
a refractive index of the first recycling component layer is equal to a refractive index of the first color film layer;
in a wave band smaller than the wavelength of the emergent light of the first-kind sub pixel, a refractive index of the first quantum dot conversion layer is greater than the refractive index of the first recycling component layer; and
in a wave band greater than or equal to the wavelength of the emergent light of the first-kind sub pixel, the refractive index of the first quantum dot conversion layer is smaller than the refractive index of the first recycling component layer.

2. The array substrate according to claim 1, wherein the first-kind sub pixel is a red sub pixel and/or a green sub pixel.

3. The array substrate according to claim 2, wherein the first quantum dot conversion layer comprises:
red quantum dots and scattering particles; and/or
green quantum dots and the scattering particles.

4. The array substrate according to claim 1, wherein the sub pixel further comprises:
a second-kind sub pixel;
wherein the second-kind sub pixel comprises:
a scattering layer, a planarization layer and a second color film layer sequentially located on the side, facing away from the base substrate, of the excitation light source; and
wherein a wavelength of emergent light of the second-kind sub pixel is smaller than the wavelength of the emergent light of the first-kind sub pixel.

5. The array substrate according to claim 4, wherein:
a refractive index of the scattering layer is smaller than or equal to a refractive index of the planarization layer; and
the refractive index of the planarization layer is smaller than or equal to a refractive index of the second color film layer.

6. The array substrate according to claim 4, wherein:
the first quantum dot conversion layer is arranged on a layer same as the scattering layer;
the first recycling component layer is arranged on a layer same as the planarization layer; and
the first color film layer is arranged on a layer same as the second color film layer.

7. The array substrate according to claim 4, wherein a thickness of the first-kind sub pixel is equal to a thickness of the second-kind sub pixel in a direction perpendicular to the base substrate.

8. The array substrate according to claim 4, wherein the second-kind sub pixel is a blue sub pixel.

9. The array substrate according to claim 4, wherein the excitation light source is configured to emit white light or blue light.

10. A method for preparing the array substrate according to claim 1, comprising:
providing a base substrate;
forming an excitation light source on the base substrate; and
forming a first-kind sub pixel on a side of a light emergent surface of the excitation light source;
wherein the first-kind sub pixel comprises a first quantum dot conversion layer, a first recycling component layer and a first color film layer sequentially located on the excitation light source.

11. The method according to claim 10, further comprising:
forming a second-kind sub pixel on the side of the light emergent surface of the excitation light source;
wherein an orthographic projection of the second-kind sub pixel on the base substrate is not overlapped with an orthographic projection of the first-kind sub pixel on the base substrate; and
the second-kind sub pixel comprises a scattering layer, a planarization layer and a second color film layer sequentially located on the excitation light source.

12. A display panel, comprising the array substrate according to claim 1, and an encapsulation cover plate on a side of a light emergent surface of the array substrate.

13. A display apparatus, comprising the display panel according to claim 12, and a protective shell surrounding the display panel.

14. An array substrate, comprising:
a base substrate;
an excitation light source on a side of the base substrate; and
a sub pixel on a side, facing away from the base substrate, of the excitation light source;
wherein the sub pixel at least comprises:
a first-kind sub pixel;
wherein the first-kind sub pixel comprises:
a first quantum dot conversion layer, a first recycling component layer and a first color film layer sequentially located on the side, facing away from the base substrate, of the excitation light source;
wherein the first recycling component layer is configured to limit at least part of light with a wavelength, smaller than a wavelength of emergent light of the first-kind sub pixel, into the first quantum dot conversion layer;

a refractive index of the first quantum dot conversion layer is equal to a refractive index of the first recycling component layer;

in a wave band smaller than a wavelength of the emergent light of the first-kind sub pixel, the refractive index of the first recycling component layer is greater than a refractive index of the first color film layer; and in a wave band greater than or equal to the wavelength of the emergent light of the first-kind sub pixel, the refractive index of the first recycling component layer is smaller than the refractive index of the first color film layer.

15. The array substrate according to claim 14, wherein the first-kind sub pixel is a red sub pixel and/or a green sub pixel.

16. The array substrate according to claim 15, wherein the first quantum dot conversion layer comprises:
red quantum dots and scattering particles; and/or
green quantum dots and the scattering particles.

17. The array substrate according to claim 14, wherein the sub pixel further comprises:
a second-kind sub pixel;
wherein the second-kind sub pixel comprises:
a scattering layer, a planarization layer and a second color film layer sequentially located on the side, facing away from the base substrate, of the excitation light source; and
wherein a wavelength of emergent light of the second-kind sub pixel is smaller than the wavelength of the emergent light of the first-kind sub pixel.

18. The array substrate according to claim 17, wherein:
a refractive index of the scattering layer is smaller than or equal to a refractive index of the planarization layer; and
the refractive index of the planarization layer is smaller than or equal to a refractive index of the second color film layer.

19. The array substrate according to claim 17, wherein:
the first quantum dot conversion layer is arranged on a layer same as the scattering layer;
the first recycling component layer is arranged on a layer same as the planarization layer; and
the first color film layer is arranged on a layer same as the second color film layer.

20. The array substrate according to claim 17, wherein a thickness of the first-kind sub pixel is equal to a thickness of the second-kind sub pixel in a direction perpendicular to the base substrate.

* * * * *